(12) United States Patent
Tsai et al.

(10) Patent No.: US 6,291,827 B1
(45) Date of Patent: Sep. 18, 2001

(54) INSULATING APPARATUS FOR A CONDUCTIVE LINE

(75) Inventors: Pei-Wei Tsai; Hua-Jen Tseng, both of Chu Pei; Dong-Tay Tsai, Kaohsiung; Fu-Chih Huang, Tainan, all of (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/276,865

(22) Filed: Mar. 26, 1999

(51) Int. Cl.[7] ................................................. H01J 37/317
(52) U.S. Cl. ........................ 250/492.21; 250/492.2; 250/493.3; 250/423 R; 250/440.11; 250/396 R
(58) Field of Search ........................... 250/492.21, 492.2, 250/493.3, 423 R, 396 R, 440.11

(56) References Cited

U.S. PATENT DOCUMENTS 5,483,077 * 1/1996 Glavish .............................. 250/492.2
5,959,396 * 9/1999 Moreshead et al. ............... 313/363.1
6,151,527 * 11/2000 Boutos .................................. 607/138

* cited by examiner

*Primary Examiner*—Bruce Anderson
*Assistant Examiner*—Nikita Wells
(74) *Attorney, Agent, or Firm*—Nath & Associates PLLC; Harold L. Novick

(57) ABSTRACT

A novel insulating apparatus for a conductive line is disclosed. The proposed insulating apparatus can be applied to various conductive lines with different shapes. The problem of short circuit can be solved by the present insulating apparatus with the novel connecting configuration. The present invention comprises a plurality of insulator rings worn on the conductive line in series, wherein the insulator rings are annular cylinders. Each of the annular cylinders has an outer diameter larger than the inner diameter of the ones next to it. In addition, each of the annular cylinders has a length sized according to the desired flexibility of the conductive line.

7 Claims, 4 Drawing Sheets

INSULATING APPARATUS FOR A CONDUCTIVE LINE

BACKGROUND OF THE INVENTION

1. Field of the Invention

The present invention relates to an insulating apparatus, and more especially, to an insulating apparatus used in a connecting wire of an suppression electrode of an ion implanter.

2. Description of the Prior Art

Ion implantation is a widely used technique in the semiconductor industry, in which energetic, charged atoms or molecules are directly introduced into a substrate. In an integrated circuit fabrication, ion implantation is primarily used to add dopant ions into the surface of silicon wafers. Most of the impurity-doped regions, such as N-type and P-type well regions, source and drain regions, channel stop regions, and doped polysilicon electrode, can be fabricated by ion implantation, with or without the process of drive-in.

Typically, an ion implanter system, which is used to carried out the ion implantation process, comprises a ion source, an extraction device, a mass analysis, an accelerator, a scanning system, and other attached equipment such as gas delivery system, high vacuum system, and so on. In this ion implanter system, the ion source, which is generally an arc chamber, is used to ionize the source gases to form the ion gases. The ionized gases are extracted from the source chamber by an extraction electrode assembly. The extracted ion beam passes by a mass analysis, and the ions of undesired species are filtered out according to their masses. The accelerator creates an acceleration field to increase the ion energy to a desired level, and the scanning system distributes the ions uniformly over the target.

FIG. 1 depicts a portion of an ion implanter, including an ion source as an arc chamber 10 and an extraction electrode assembly 20. The arc chamber 10 is basically a DC plasma generator, which accesses source gases from a gas feeding system not shown in the figure. The source gases are ionized in the arc chamber 10 through collision with electrons from an arc discharge, which is typically a hot filament. After the ionized plasma gases is generated, the extraction electrode assembly 20 is applied to extract the ionized gases out from the arc chamber 10.

The extraction electrode assembly 20 consists essentially of an extraction electrode 22 and a suppression electrode 24, with proper insulator deposed between them. The extraction electrode 22 is grounded to provide a voltage relatively lower than that of the arc chamber, which usually maintains at the level of tens of kilo voltage during operation. The positive ions in the arc chamber are therefore attracted by the lower voltage and move toward the extraction electrode 22 out from the arc chamber 10. Being adjusted and focused, the extracted ion beam passes the extraction electrode assembly 20 through a slit 26 therein, with the direction indicated by the arrow 30, and then flow toward the mass analysis and accelerator disposed downstream.

To focus and adjust the extracted ion beam, a suppression power with high negative voltage of about −1.8 KV is applied to the suppression electrode 24 deposed in the extraction electrode assembly 20. The suppression electrode 24 typically comprises a graphite plate 34, a metal plate 36 and a conductive rod assembly 38 connecting between them. The graphite plate 34 can provide the protection to the metal from the attack of the extracted ions to prevent damages and the generation of X-ray. With the electric field created by the suppression voltage, the extracted ion beam can be adjusted and prevented from blow-up (in the other words, be focused), and the arrival of unwanted electrons to the linear acceleration area, which is created by the accelerator downstream, can be suppressed.

To implement the focusing of the extracted ion beam, the suppression electrode 24 is secured to the extraction electrode assembly 20 as an integral device, and a supporting arm 32 is mounted to the grounded extraction electrode 22, to provide support, grounded connection, and the capability of position adjustment. When the supporting arm 32 moves, the positions of the electrodes, and thus the slit 26 and the suppression electric field is regulated to adjust the ion beam.

For providing suppression power to the suppression electrode 24, a conductive line 50 extends from a power source 60 to the suppression electrode 24, in connection with one of the conductive rods 38. The conductive line 50 is typically a coil with a certain cross section area. In the high-energy ion implanter EATON HE from EATON Inc., the conductive line 50 of coil type is disposed across the supporting arm 32 as shown in FIG. 2. In this configuration, the conductive line 50 is easy to form a short circuit with the grounded supporting arm 32, when the supporting arm 32 is operated to adjust the extraction electrode assemble 20. Once the short circuit phenomenon occurs, the suppression current will become very large, and the ion beam can not be focused any more. The implanter thus goes wrong. To set the machine right, it needs to shutdown the machine, vent the chamber pressure to atmosphere, and disassembly the electrode to adjust the power wire. These works takes a lot of time and will cause great loss of efficiency.

SUMMARY OF THE INVENTION

The present invention proposes a novel insulating apparatus for a conductive line. The proposed insulating apparatus can be applied to various conductive lines with different shapes. A novel connecting configuration between the power source and the suppression electrode of an ion implanter is also disclosed. The problem of short circuit can be solved by the present insulating apparatus with the novel connecting configuration.

The present invention proposes an insulating apparatus deposed on a conductive line, which comprises a plurality of insulator rings worn on the conductive line in series, wherein the insulator rings are annular cylinders. Each of the annular cylinders has an inner diameter equal to or larger than the outer diameter of the conductive line, and has an outer diameter larger than the inner diameter of the ones next to it. In addition, each of the annular cylinders has a length sized according to the desired flexibility of the conductive line.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a novel insulating apparatus for a conductive line. The proposed insulating apparatus can be applied to various conductive lines with different shapes, no matter a normal simple wire, a coil, or a conductive line with any other shape. With a novel connecting configuration between the power source and the suppression electrode of an ion implanter, the present apparatus can insulate the connecting conductive line to prevent from the phenomenon of short circuit.

Figure 1:
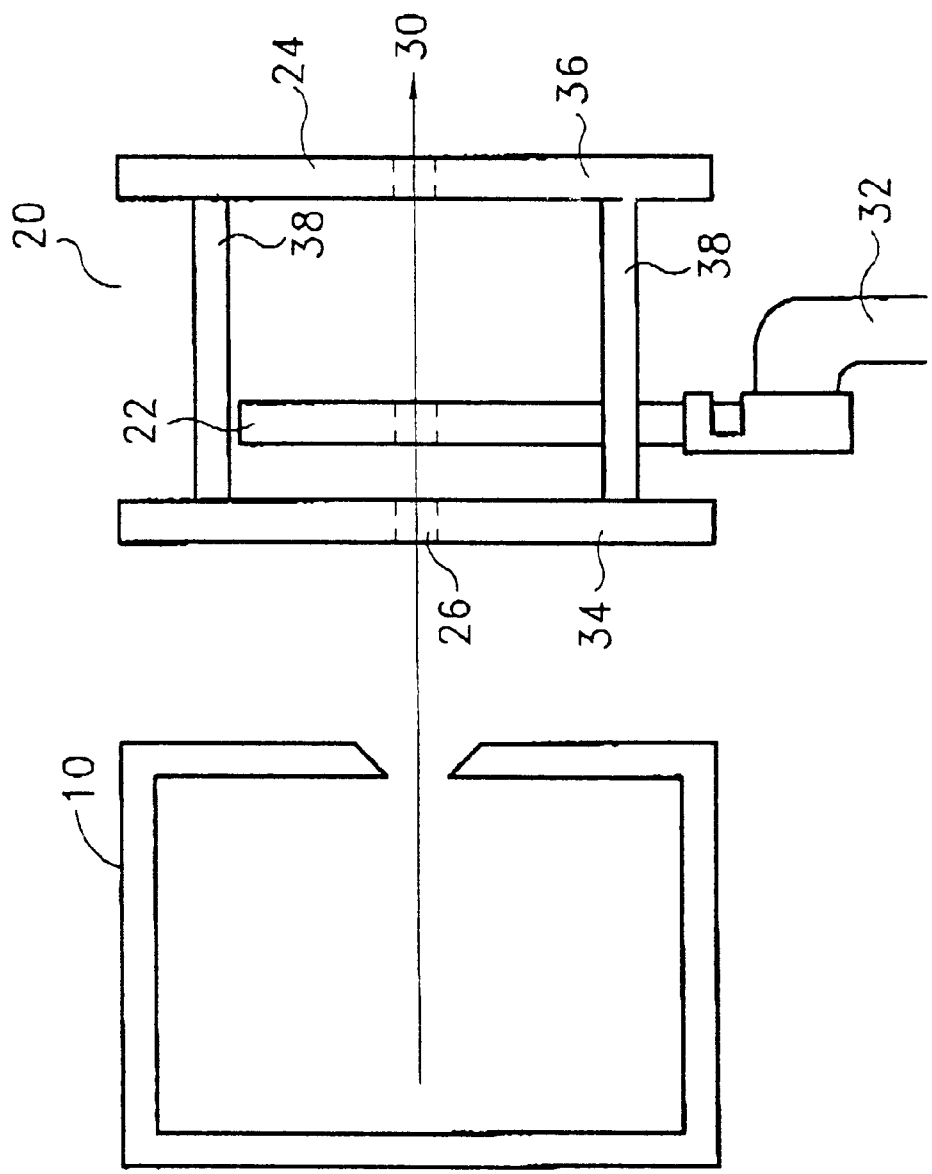
FIG. 1 is a cross-sectional view of a portion of an ion implanter including an arc chamber and an extraction electrode assembly according to the prior art.
Figure 2:
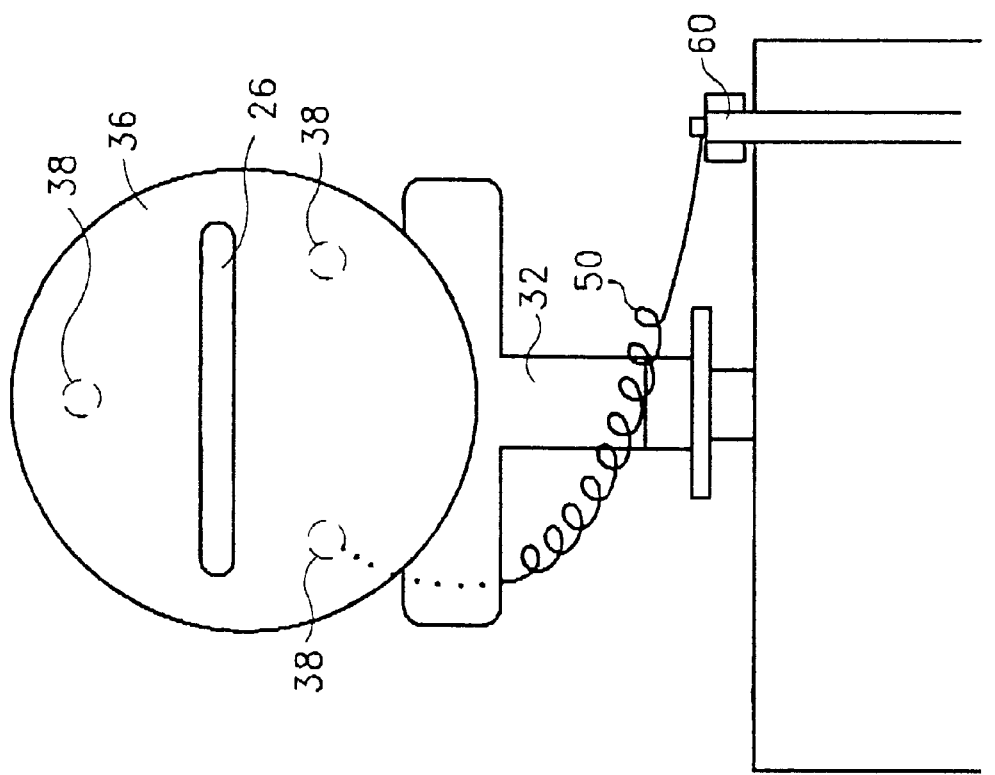
FIG. 2 is a side view of a portion of an extraction electrode assembly of an ion implanter including a suppression electrode according to the prior art.
Figure 3:
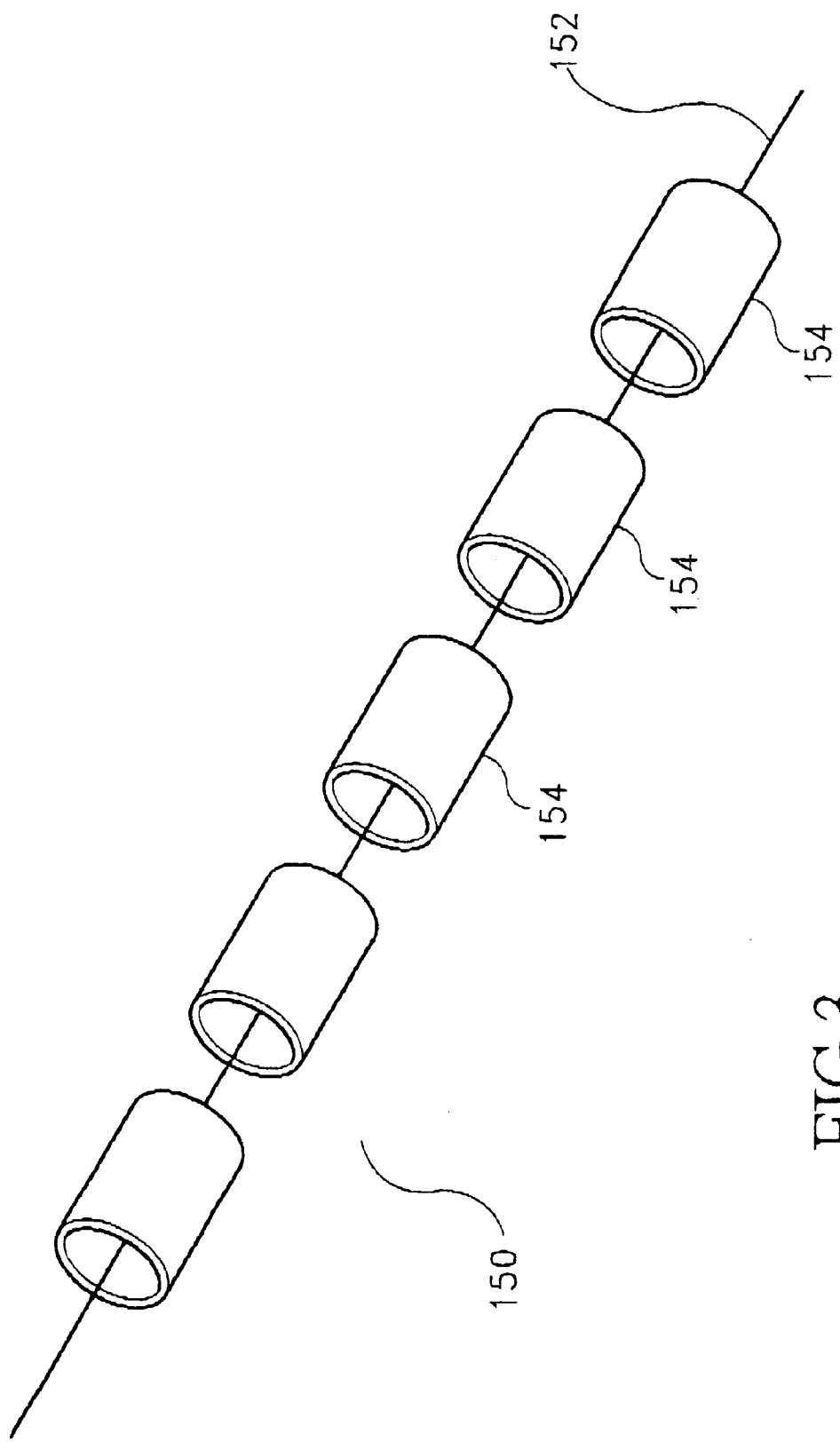
FIG. 3 is a perspective view of the insulating apparatus for a conductive line according to the present invention.

FIG. 3 illustrates a preferred embodiment of the connecting apparatus 150 of the present invention. A simple wire 152 is used in this embodiment to minimize the cross section area of the conductive line, and thus minimize the possibility of contact to the grounded electrode and supporting arm. In the other embodiment, other types of conductive line such as a coil can also be used.

On the conductive line 152, a plurality of insulator rings 154 is applied to be an insulating apparatus for the conductive line. Each of the rings 154 is basically an annular cylinder with a certain length and certain diameters. The inner diameter of the rings is sized to fit the conductive line in order to be fluidically worn in serious on the line; that is, the inner diameter of the rings is equal to or larger than the outer diameter of the conductive line. In addition, the sizes of the insulator rings 154 are not necessarily the same as each other, as long as the conditions described above hold without overlap between two rings next to each other. To conform to this condition without overlap, the outer diameter of a ring is set larger than the inner diameter of the next ones.

Under the condition of the multi-section design, the insulator rings 154 can be made of rigid materials such as Teflon or ceramics without substantial influence on its flexibility. The thickness of the ring wall between the inner and outer diameters should be designed depending on the capability of insulation needed for the rings, and generally depending on the insulating material of the rings and the level of the power supplied to the conductive line. Generally, the better the insulation capability of the material is, the thinner the insulator rings 154 need. In a normal embodiment, the thickness of the insulator rings 154 can be ignored in comparison with its diameter.

The length of the insulator rings 154 is also an adjustable parameter. It is still not necessary that all the insulator rings 154 have the same axial length. Naturally, the shorter the axial length of the insulator rings 154 is, the more flexible the conductive line can be. Therefore, a longer ring 154 should be adopted for a smooth condition, and a shorter one for a irregular condition. The flexibility of the insulated conductive line 150 is therefore can be regulated by adjusting the length of the insulator ring 154. In a preferred embodiment, an insulator ring 154 with the length of about 0.6 to 1.0 cm is applied.

Figure 4:
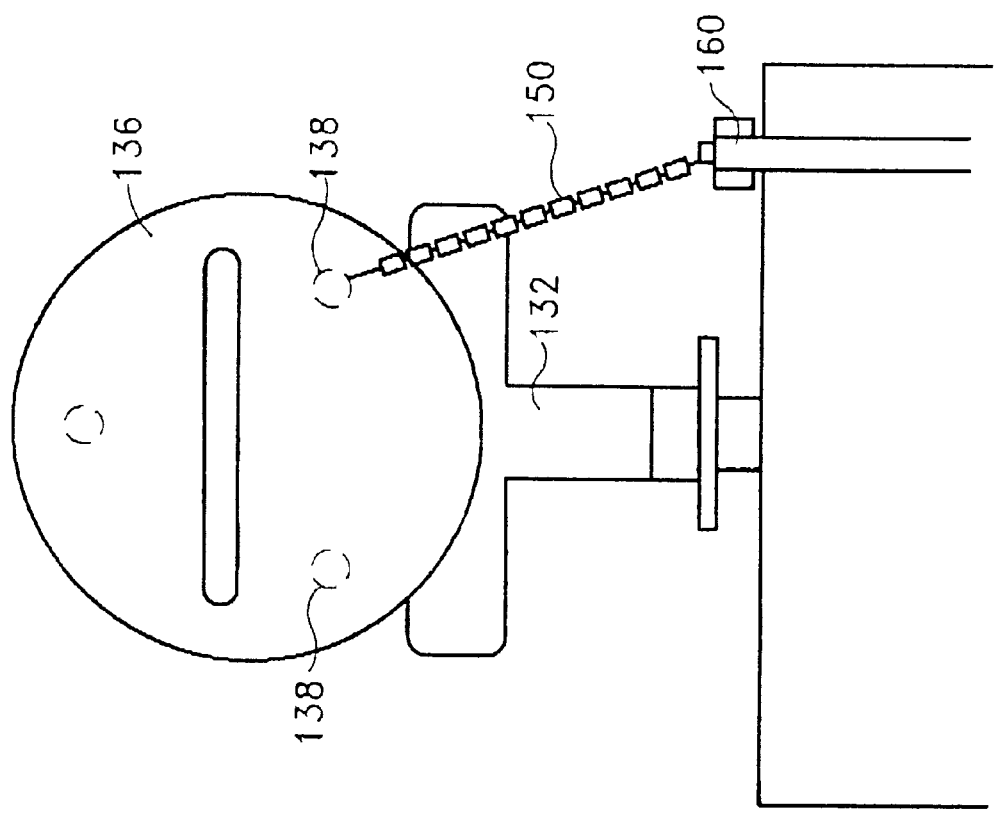
FIG. 4 is a side view of a portion of an extraction electrode assembly of an ion implanter including a suppression electrode according to the present invention.

Referring to FIG. 4, the present invention also proposes a connecting configuration between the power source 160 and the suppression electrode 136 of an ion implanter. The conductive line 150 extends from the power source 160 and connects to the suppression electrode 136 at the same side related to the supporting arm 132. With this configuration, the possibility of the conductive line 150 contact to the support arm 132 can be minimized. The phenomenon of short circuit is thus substantially reduced.

In accordance with the embodiments described above, the present invention proposes an insulating apparatus with flexible shape that can be accommodated for various environment conditions, by wearing a plurality of individual insulator rings 154 in serious on a conduction line 152. The present insulating apparatus can be applied to various types of conductive line including a normal simple wire, a coil, or a conductive line with any other shape. The flexibility of the insulated conductive line 150 can be increased. With a novel connecting configuration between the power source and the suppression electrode of an ion implanter, the present apparatus can provide a better insulation for the connecting conductive line to prevent from the phenomenon of sort circuit.

As is understood by a person who is skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. For example, a cylinder ring with a cross-sectional shape other than a circuit can be applied to the present invention, and therefore is included within the scope of the appended claims.

What is claimed is:

1. An insulating apparatus deposed on a conductive line, said apparatus comprises:

a plurality of insulator rings worn on said conductive line in series, said insulator rings are annular cylinders and have an axial length of about 0.6 to 1.0 centimeter determined by the desired flexibility of said conductive line, and each of said insulator rings has an inner diameter larger than or equal to the outer diameter of said conductive line.

2. The insulating apparatus according to claim 1, wherein each of said insulator rings has an outer diameter larger than the inner diameter of the ones next to it.

3. A connecting structure for applying power to a suppression electrode of an extraction electrode assembly of an ion implanter, which is supported by a supporting arm, said connecting structure comprises:

a conductive power line connecting between a power source and said suppression electrode; and an insulating apparatus of a plurality of insulator rings worn on said conductive line in series, said insulator rings are annular cylinders and have an axial length of about 0.6 to 1.0 centimeter determined by the desired flexibility of said conductive line, and each of said insulator rings has an inner diameter larger than or equal to the outer diameter of said conductive line.

4. The insulating apparatus according to claim 3, wherein said conductive power line is connecting between a power source and said suppression electrode at the same side related to the supporting arm.

5. The insulating apparatus according to claim 3, wherein each of said annular cylinders has an outer diameter larger than the inner diameter of the ones next to it.

6. An connecting structure for applying power to an suppression electrode of an extraction electrode assembly of an ion implanter, which is supported by a supporting arm, said structure comprises:

a conductive power line connecting between a power source and said suppression electrode at the same side related to the supporting arm; and an insulating apparatus of a plurality of insulator rings worn on said conductive line in series, said insulator rings are annular cylinders and have an axial length of about 0.6 to 1.0 centimeter determined by the desired flexibility of said conductive line, and each of said insulator rings has an inner diameter larger than or equal to the outer diameter of said conductive line.

7. The insulating apparatus according to claim 6, wherein each of said insulator rings has an outer diameter larger than the inner diameter of the ones next to it.

* * * * *